United States Patent [19]

Bozovic et al.

[11] Patent Number: 5,399,881
[45] Date of Patent: Mar. 21, 1995

[54] HIGH-TEMPERATURE JOSEPHSON JUNCTION AND METHOD

[75] Inventors: Ivan Bozovic; James N. Eckstein, both of Palo Alto; Martin E. Klausmeier-Brown, San Jose; Gary F. Virshup, Cupertino, all of Calif.

[73] Assignee: Varian Associates, Inc., Palo Alto, Calif.

[21] Appl. No.: 56,557

[22] Filed: Apr. 30, 1993

[51] Int. Cl.$^6$ ............................................. H01L 39/22
[52] U.S. Cl. ...................................... 505/190; 257/31; 257/33; 505/1; 505/702; 505/729; 505/329
[58] Field of Search ..................... 257/33, 31, 32, 34, 257/35, 36; 427/62; 437/910; 505/1, 702, 729, 732, 782

[56] References Cited

U.S. PATENT DOCUMENTS

| | | | |
|---|---|---|---|
| 5,047,390 | 10/1991 | Higashino et al. | 505/1 |
| 5,227,363 | 7/1993 | Furukawa et al. | 505/1 |
| 5,250,817 | 10/1993 | Fink | 257/35 |

FOREIGN PATENT DOCUMENTS

2-125672  5/1990  Japan ................................. 505/702

OTHER PUBLICATIONS

Article by D. B. Schwartz et al., entitled "The Observation of the AC Josephson Effect in a $YBa_2Cu_3O_7$/Au/$YBa_2Cu_3O_7$ Junction", published in *IEEE Transactions on Magnetics*, vol. 25, No. 2, Mar. 1989, pp. 1298–1299.

Article by C. T. Rogers, et al., entitled; "Fabrication of heteroepitaxial $YBa_2Cu_3O_{7-x}$–$PrBa_2Cu_3O_{7-x}$–$YBa_2Cu_3O_{7-x}$ Josephson devices grown by laser deposition" published in *Appl. Phys. Lett.* 55, Nov. 6, 1989, pp. 2032–2034.

Article by K. Mizung et al., entitled "Fabrication of $Bi_2Sr_2Ca_1Cu_2O_{8+\delta}$/$Bi_2Sr_2Nd_1Cu_2O_{8+\delta}$/$Bi_2Sr_2Ca_1Cu_2O_{8+\delta}$ Josephson Junctions", published in *Japanese Journal of Applied Physics*, on Sep. 1991, pp. L1559–L1561.

Article by K. Kimura et al., entitled "Doping Enhancement by Excimer Laser Irradiation in Gas Source Molecular Beam Epitaxy of GaAs", published in *Japanese Journal of Applied Physics*, on Mar. 1987, pp. L200–L202.

Article by J. Moreland et al., entitled "Evidence for the superconducting proximity effect in junctions between the $YBa_2Cu_3O_x$ thin film", published in *Appl. Phys. Lett.* 54, on Apr. 10, 1989, pp. 1477–1479.

Article by R. B. Laibowits et al., entitled "All high $T_c$ edge junctions and SQUIDs", published in *Appl. Phys. Lett.* 54, on Feb. 10, 1990, pp. 686–688.

Article by R. H. Koch et al., entitled "Quantum interference devices made from superconducting oxide thin films", published in *Appl. Phys. Lett.* 51, on Jul. 20, 1987, pp. 200–202.

Article by J. Gao et al., entitled "Controlled preparation of all high-$T_c$ SNS-type edge junctions and DC SQIDs", published in *Physics C* 171, on 1990, pp. 126–130.

Article by J. Gao, titled "Characteristics of advanced $YBa_2Cu_3O_x$–$PrBa_2Cu_3O_x$/$YBa_2Cu_3O_x$ edge type junctions", published in *Appl. Phys. Lett.* 59, on Nov. 18, 1991, pp. 2754–2756.

Article by K. Mjzuno, entitled "Fabrication of thin-film-type Josephson junctions using a Si–Sr–Ca–Cu–O/Bi–Sr–Cu–O/Bi–Sr–Cu–O structure", published in *Appl. Phys. Lett.* 56, on Apr. 9, 1990, pp. 1469–1471.

Article by P. M. Mankiewich et al., entitled "Fabrication and Characterization of an $YBa_2Cu_3O_7$/AU/$YBa_2Cu_3O_7$S–N–S Microbridge", published in *SPIE vol. 948 High-$T_c$ Superconductivity: Thin Films and Devices*, on 1988, pp. 37–40.

*Primary Examiner*—Sara W. Crane

[57] ABSTRACT

A hysteretic high-$T_c$ trilayer Josephson junction, and a method of forming the same are disclosed. The junction includes lower and upper high $T_c$ superconducting cuprate films separated by a barrier layer, where the thin films each include a molecular junction layer adjacent the barrier layer which is characterized by a high-$T_c$ cuprate stoichiometry and crystal structure, and a flat two-dimensional surface, as evidenced by its electron diffraction pattern using reflected high-energy electron diffraction. The junction and barrier layers in the junction are formed by atomic layer-by-layer deposition.

18 Claims, 7 Drawing Sheets

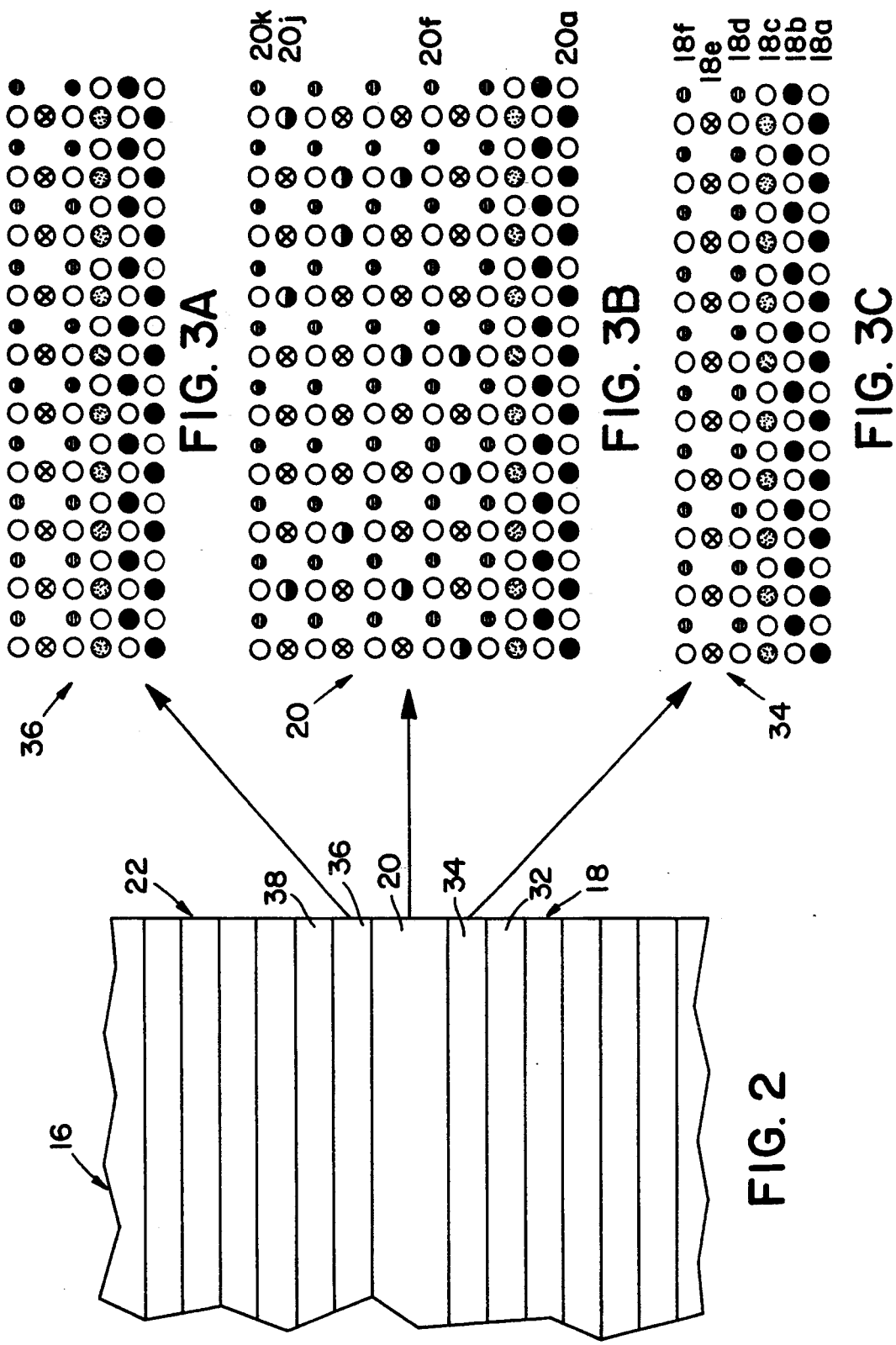

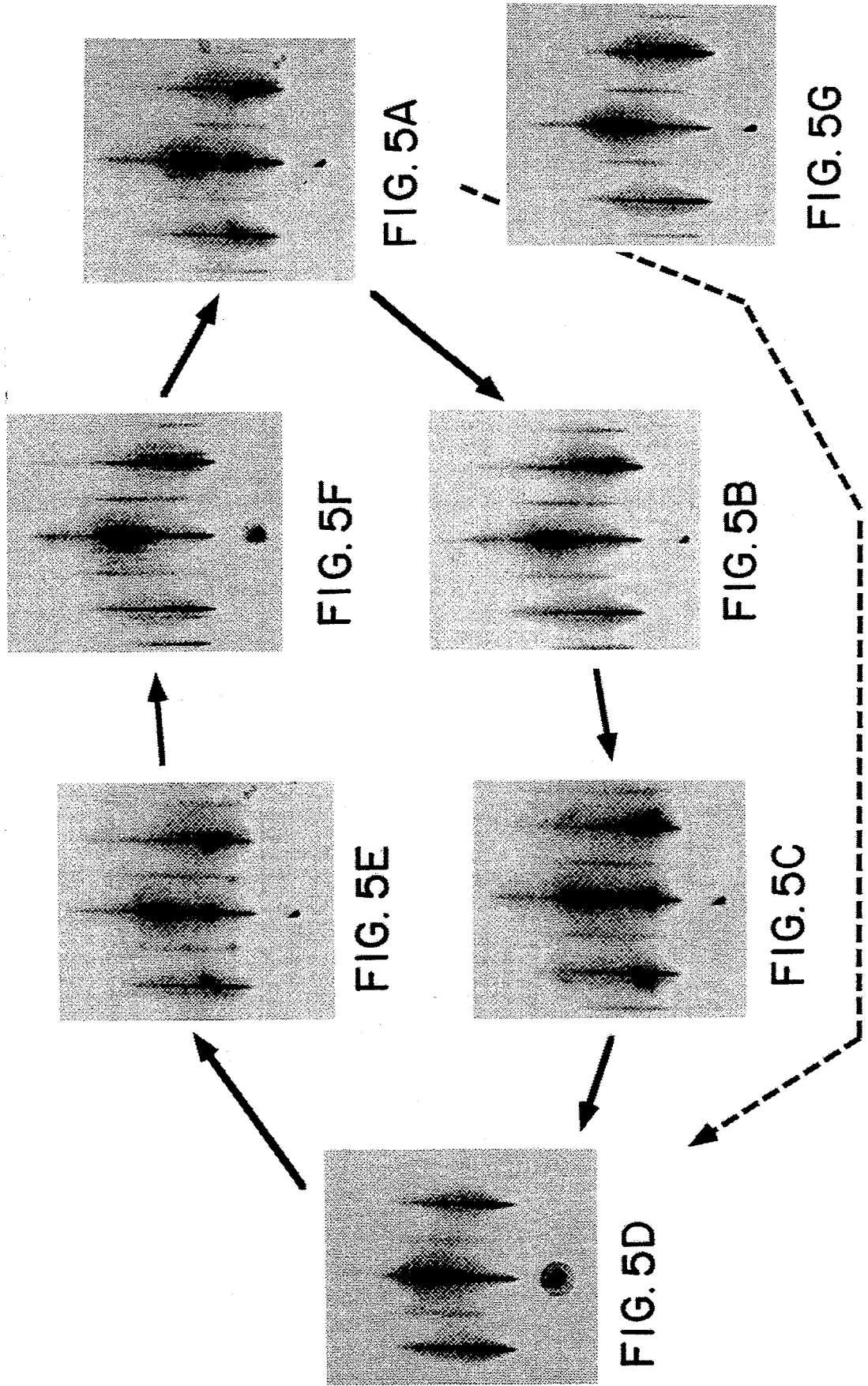

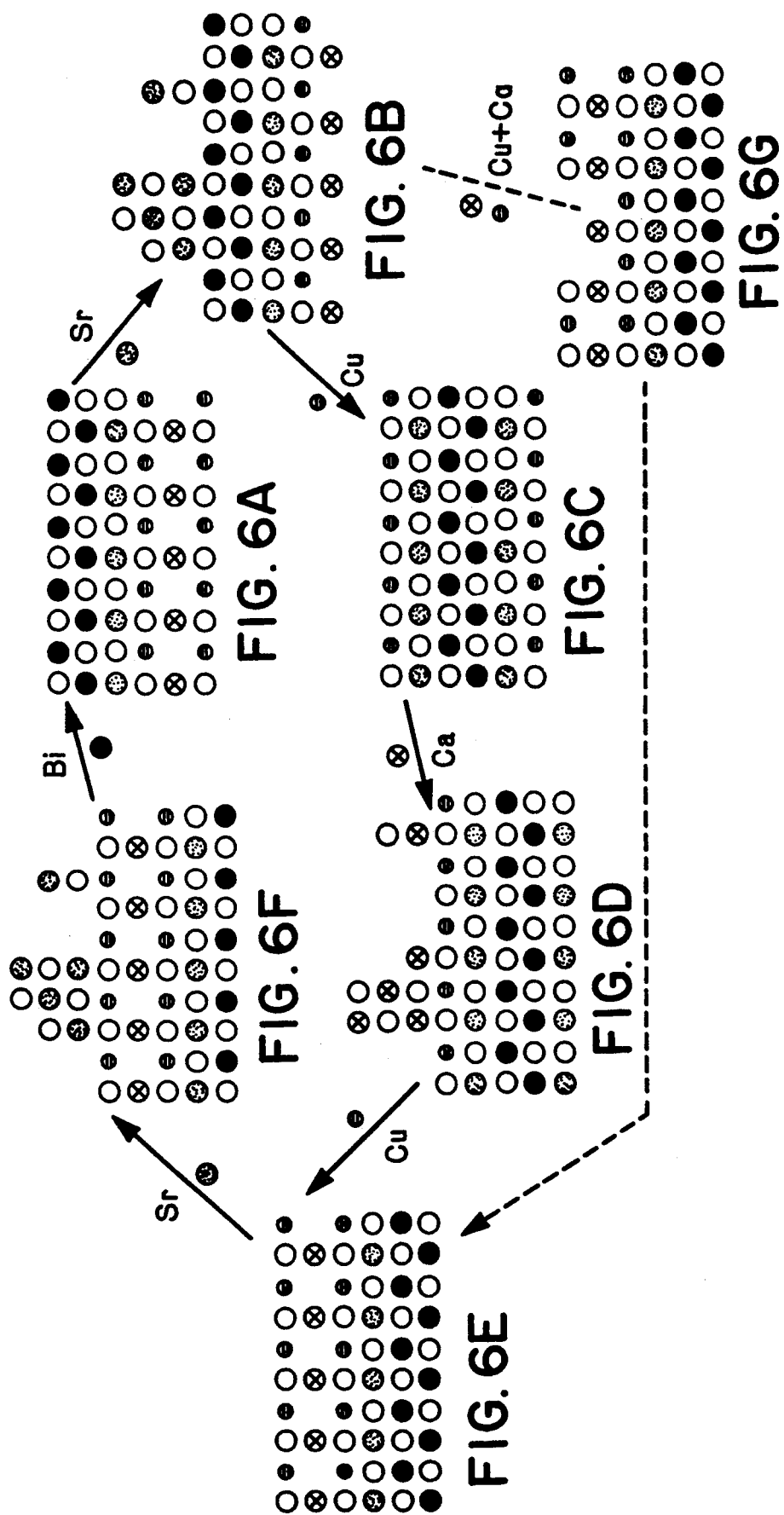

HIGH-TEMPERATURE JOSEPHSON JUNCTION AND METHOD

The present invention was supported in part by Grant ONR/DARPA Contract N00014-88-C-0760. The government has certain rights in this invention.

1. FIELD OF THE INVENTION

The present invention relates to a high-$T_c$ Josephson junction and method of making the same.

2. REFERENCES

Berkley, D. D., et al., Appl. Phys. Lett. 531973 (1988).
Bozovic, I., et al., in *Science and Technology of Thin Film Superconductors II* (McConnell and Wolf, Eds.) Plenum, New York, p. 267 (1990).
Char, K., et al., Appl. Phys. Lett. 59:773 (1991).
Chin, D. K., et al., Appl. Phys. Lett. 58:753 (1991).
DiIorio, M. S., et al., Appl. Phys. Lett. 58:2552 (1991).
Eckstein, J. N., et al., Appl. Phys. Lett. 57:931 (1990a).
Eckstein, J. N., et al., Appl. Phys. Lett. 57:1049 (1990b).
Eckstein, J. N., et al., J. Cryst. Growth 111:973 (1991).
Eckstein, J. N., et al., MRS Bulletin 27 (August, 1992).
Face, D. W., et al., Physica C. 162–164:709 (1990).
Forrester, M. G., et al., IEEE Trans. Mag. 27:3098 (1991).
Gao, J., et al., Physica C. 171:126 (1990).
Gao, J., et al., Appl. Phys. Lett. 59:2754 (1991).
Gijs, M. A. M., et al., Appl. Phys. Lett. 59:1233 (1991).
Hauser, et al., Appl. Phys. Lett. 52:844 (1988).
Hunt, B. D., et al., SPIE Proc. 1597 (1991) (in press).
Klausmeier-Brown, M. E., et al., Appl. Phys. Lett. 60:657 (1992).
Klausmeier-Brown, M. E., et al., Appl. Phys. Lett. (in press, 1992).
Koch, R. H., et al., Appl. Phys. Lett. 51:200 (1987).
Koch, R. H., et al., Appl. Phys. Lett. 53:951 (1989).
Kupriyanov, M. Y., et al., Soy. Phys. Uppekhi 33:340 (1990).
Laibowitz, R. B., et al., Appl. Phys. Lett. 56:686 (1990).]
Mankiewich, P. M., et al., SPIE Proc. 948:37 (1988).
Mizuno, K., et al., Appl. Phys. Lett. 56:1469 (1990).
Mizuno, K., et al., Jpn. J. Appl. Phys. 56:L1559 (1991).
Moreland, J., et al., Appl. Phys. Lett. 54:1477 (1989).
Nakane, H., et al., Jpn. J. Appl. Phys. 26:L200 (1987).
Ono, R. H., et al., Appl. Phys. Lett. 51:1126 (1991).
Rogers, C., et al., Appl. Phys. Lett. 55:2032 (1989).
Schlom, D. G., et al., J. Cryst. Growth 102:361 (1990).
Schlom, D. G., et al., in *Advances in Superconductivity III* (Kajimura and Hayakawa, Eds.) Springer, Tokyo, p. 1011 (1991).
Schwarz, D. B., et al., IEEE Trans. Mag. 25:1298 (1989).
Tamegai, T., et al., Jpn. J. Appl. Phys. 28:L112 (1989).
Virshup, G. F., et al., Appl. Phys. Lett. 60(18):2289 (1992).
Wire, M. S., et al., IEEE Trans. Mag. 27:3106 (1991).
Zimmerman, J. E., et al., Appl. Phys. Lett. 51:617 (1987).

3. BACKGROUND OF THE INVENTION

Josephson junctions form the basis of much of superconductive electronics, both analog and digital, and thus using high-temperature superconductors to fabricate such junctions has been of considerable interest. A variety of Josephson junction technologies have been explored for high-temperature superconduction junctions, including grain-boundary junction (Koch, 1987; Nakane; Zimmerman; Hauser; Koch, 1989; Face; Char), step edge junctions (Laibowitz; Gao, 1990, 1991, Chin; Hunt), and metal bridge (SNS) junctions (Mankiewich; Schwarz; Moreland; Forrester; DiIorio; Ono; Gijs; Wire). In addition, attempts have been made to fabricate trilayer structures and pattern them into Josephson junctions. Thus, Rogers et al. (Rogers) reported a supercurrent in $YBa_2Cu_3O_7/PrBa_2Cu_3O_7/YBa_2Cu_3O_7$ trilayers deposited by laser ablation. Mizuno et al. (Mizuno, 1990a) employed $Bi_2Sr_2CaCu_2O/Bi_2Sr_2CuO_6/Bi_2Sr_2CaCu_2O_8$ trilayers deposited by sputtering, while Mizuno and Setsune (Mizuno, 1990b) utilized $Bi_2Sr_{2Nd}Cu_2O_8$ as the barrier material.

Ideally, for use as logic elements in electronic circuits, a Josephson junction should show a pronounced I-V hysteresis characteristics. Heretofore, date, efforts to produce a Josephson junction employing high-$T_c$ thin films and having pronounced I-V hysteresis characteristics have not been reported.

4. SUMMARY OF THE INVENTION

The invention includes, in one general aspect, a hysteretic high-$T_c$ trilayer Josephson junction device. The junction in the device, which includes a substrate, first and second high-$T_c$ cuprate superconducting films, and a barrier layer separating the two films, is characterized by (i) a critical current of greater than 10 $\mu A$; and (ii) significant I-V hysteresis.

In a preferred construction, the first and second high-$T_c$ films each has a junction molecular layer adjacent the barrier layer which is characterized by a high-$T_c$ cuprate stoichiometry and crystal structure, and a flat two-dimensional surface, as evidenced by its electron diffraction pattern using reflected high-energy electron diffraction (RHEED), and a barrier layer which is characterized by a flat two-dimensional surface, as evidenced by its electron diffraction pattern using RHEED.

The high-$T_c$ molecular junction layers are formed, in a general embodiment, of $Bi_2Sr_2Ca_{n-1}Cu_nO_{2n+4}$ type metal oxides, where n is 2–5, and the barrier layer is formed of $Bi_2Sr_2(Ca,Sr,Dy,Bi)_{n-1}Cu_nO_{2n+4}$ type metal oxide where n is 2–20, and Sr, Dy, and/or Bi are substituted as barrier dopants in Ca sites in the barrier layer in an amount sufficient to reduce the conductivity and carrier density of said barrier layer. For example, the first and second high-$T_c$ films may be formed of $Bi_2Sr_2CaCu_2O_8$ oxide, and the barrier layer may be formed of a $Bi_2Sr_2(Ca,Sr,Dy,Bi)_{n-1}Cu_nO_{2n+4}$ type metal oxide where n is 7–10, and the barrier dopant is present at a stoichiometry between 0.5 and 1.

In a related aspect, the invention includes an improved high-$T_c$ trilayer Josephson junction having first and second high-$T_c$ cuprate thin layers separated by a molecular insulating barrier layer. The improvement, which is effective to achieve I-V hysteresis characteristics in the junction, includes junction and barrier layers of the type described above.

In another aspect, the invention includes a method of preparing a hysteretic high-$T_c$ trilayer Josephson junction. The method includes forming on a substrate, a first and second high-$T_c$ cuprate thin films separated by a barrier, where at least the two junction molecular layers in the two films and the intermediate barrier layer are formed by atomic layer-by-layer deposition.

In a preferred embodiment, the junction molecular layers and barrier layer are formed by atomic layer-by-layer deposition of atomic metal produced by a thermal source, in the presence of ozone.

Also in a preferred embodiment, the junction high-$T_c$ molecular layers are formed of $Bi_2Sr_2Ca_{n-1}Cu_nO_{2n+4}$ type metal oxides, where n is 2-5, and the barrier layer is formed of $Bi_2Sr_2(Ca,Sr,Dy,Bi)_{n-1}Cu_nO_{2n+4}$ type metal oxide where n is 2-20, and Sr, Dy, and/or Bi are substituted as barrier dopants in Ca sites in the barrier layer in an amount sufficient to reduce the conductivity and carrier density of barrier layer.

In a related aspect, the invention includes an improvement in producing a high-$T_c$ trilayer Josephson junction of the type having first and second high-$T_c$ cuprate thin layers separated by a molecular insulating barrier layer. The improvement, which is effective to achieve I-V hysteresis characteristics in the junction, includes forming each thin film to include, adjacent the barrier layer, a junction molecular layer of the type described.

In still another aspect, the invention includes a method of tuning or varying the critical current or normal state resistance in a high-$T_c$ trilayer Josephson junction of the type having first and second high-$T_c$ $Bi_2Sr_2Ca_{n-1}Cu_nO_{2n+2}$ thin layers, where n=2-5, separated by a molecular insulating barrier layer. The improvement includes forming each thin film to include, adjacent the barrier layer, a junction molecular layer which is characterized by a high-$T_c$ cuprate lattice stoichiometry and crystal structure, and a flat two-dimensional surface, as evidenced by its electron diffraction pattern using RHEED, by atomic layer-by-layer deposition as above. The barrier layer is also deposited by atomic layer-by-layer deposition of a $Bi_2Sr_2(Ca,Sr,Dy,Bi)_{n-1}Cu_nO_{2n+4}$ type metal oxide, where n is greater than 2-20, and Sr, Dy, and/or Bi are substituted as barrier dopants in Ca sites in the barrier layer in an amount effective to produce a desired critical current or normal state resistance in the completed junction.

These and other objects and features of the invention will become more fully-apparent when the following detailed description of the invention is read in conjunction with the accompanying drawings.

BRIEF DESCRIPTION OF THE DRAWINGS

FIGS. 2 illustrates molecular junction and barrier layers in the high-$T_c$ junction of FIG. 1;

FIGS. 3A-3C show the atomic-layer structures of the lower junction molecular layer (3A), barrier molecular layer (3B), and upper junction molecular layer (3C) in the corresponding layers shown in FIG. 2;

FIGS. 5A-5G shows the buildup of a molecular $Bi_2Sr_2Ca_1Cu_2O_8$ layer by atomic layer-by-layer deposition;

FIGS. 5A-5G show RHEED patterns representing the atomic layer configurations shown in 5A-5G, respectively;

FIGS. 6A-6G shows the buildup of a molecular $Bi_2Sr_2Ca_1Cu_2O_8$ layer by atomic layer-by-layer deposition;

DETAILED DESCRIPTION OF THE INVENTION

I. Definitions

The terms below have the following meaning herein, unless otherwise noted.

The "critical temperature" or "$T_c$" is the temperature at which a superconductor compound first shows a sharp drop in resistivity, as the temperature of the compound is lowered.

A "high-temperature thin film" or "high-$T_c$ thin film" is a film formed by molecular layers of a high-$T_c$ compound, i.e., a compound having zero resistivity at a temperature greater than about 30 K (Kelvin).

A "high-$T_c$ trilayer Josephson junction" is a Josephson junction formed by two high-$T_c$ thin films separated by a barrier layer. The barrier layer may be a non-superconducting metal, a semi-conductor, or an insulator.

A "hysteretic high-$T_c$ Josephson junction" is a high-$T_c$ Josephson junction having I-V hysteresis characteristics.

"I-V hysteresis" in a Josephson junction refers to the switching behavior in the junction whereby as the current I in the junction approaches the critical current $I_o$, the voltage switches abruptly to a nonzero value, but returns to zero only when I is reduced to a value much lower than $I_o$.

The "critical current" or "$I_o$" in a Josephson junction is the maximum supercurrent that the junction can sustain.

A "high-$T_c$ superconducting cuprate" compound is a single-phase superconducting compound having one of the following crystal stoichiometries:
  (i) $M_1Ba_2Cu_3O_{7-\delta}$, where M is Y, Nd, La, Sm, Eu, Gd, Dy, Ho, Er, Tm, Yb, or Lu ("1-2-3" or "yttrium" compound);
  (ii) $Bi_2Sr_2Ca_{n-1}Cu_nO_{2n+4}$ where n=2-5 ("bismuth" compound); or
  (iii) $TlBa_{1.5}Ca_{n-1}Cu_nO_{2n+2x+2}$, where x=1 or 2, n=1-5, ("thallium" compound); or
  (iv) $La_{2-x}[Sr,Ca,Ba]_xCuO_4$, where x=0-0.3 ("lanthanum" compound).

The superconducting cuprate compound is highly anisotropic, providing high conductivity along the copper-oxygen planes (in the plane of the cuprate compound-thin films), but rather low conductivity in the direction normal to the copper-oxygen planes.

A "molecular layer" of a cuprate compound refers to the atomic layers making up a single crystalline cell of the cuprate compound.

"A high-$T_c$ cuprate stoichiometry and crystal structure" in a molecular cuprate layer refers to a crystal structure and metal atom and O atom stoichiometry necessary to confer high-$T_c$ properties to the layer.

II. Hysteretic High-$T_c$ Josephson Junction

Figure 1:
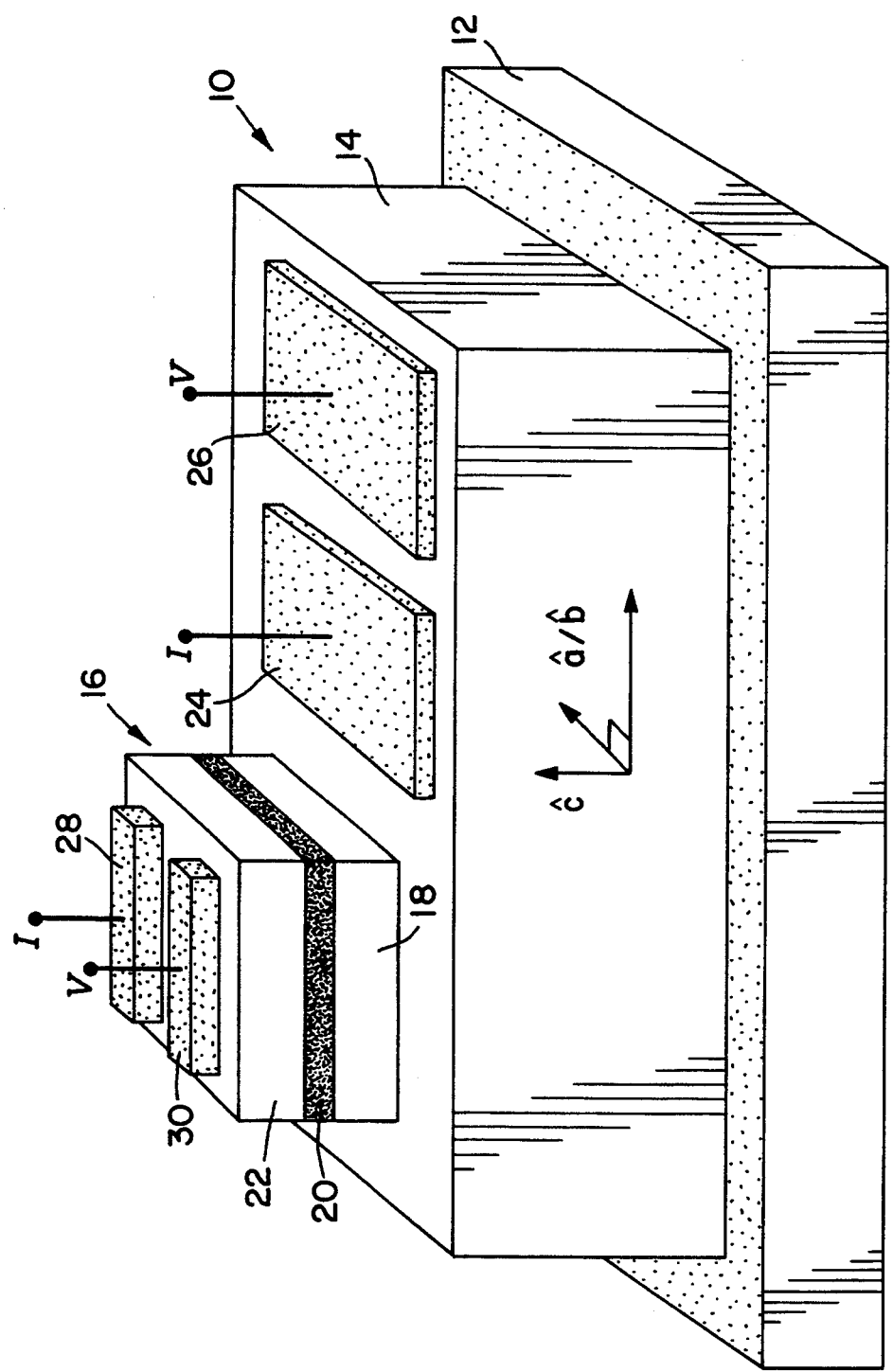
FIG. 1 shows the elements of a high-$T_c$ Josephson junction formed in accordance with one embodiment of the invention.

FIG. 1 shows the elements of a hysteretic high-$T_c$ trilayer Josephson junction device 10 in accordance with the invention. The junction includes a nonconductive substrate 12, such as an SrTiO$_3$ substrate, a high-$T_c$ superconducting cuprate block 14, and formed on the block, a trilayer junction 16 composed of a lower or first high-$T_c$ superconducting cuprate thin film 18, a barrier layer 20, and an upper or second high-$T_c$ superconducting cuprate layer 22.

Electrodes 24, 26 formed on block 14, and electrodes 28, 30 formed on layer 22 are preferably silver-film electrodes. Electrodes 24, 28 serve as current electrodes, and electrodes 26, 30, as voltage electrodes. The manner of constructing the device will be described below.

FIG. 2 shows an enlarged portion of barrier-layer region of junction 16, including adjacent portions of films 18, 22. As seen in the figure, the lower and upper high $T_c$ films in the junction are each composed of stacked molecular layers, such as layers 32, 34 forming film 18, and layers 36, 38 forming film 22. Each molecular layer in turn is composed of stacked atomic layers making up a single crystalline cell of the high-$T_c$ cuprate compound, as will be seen below with reference to FIGS. 3A-3C. Typically, each film is composed of 10-1,000 molecular layers, e.g., 40-60 molecular layers.

The molecular layer in each film which is immediately adjacent the barrier layer, i.e., layer 34 in film 18 and layer 36 in film 22, is also referred to herein as a junction layer. According to an important feature of the invention, the junction layer in the each film is characterized by a high-$T_c$ cuprate stoichiometry and crystal structure, i.e., a molecular stoichiometry and crystal structure which confer high $T_c$ superconducting properties to the layer. According to another feature, both the junction layer in lower film, and the barrier layer have flat two-dimensional surface, as evidenced by its electron diffraction pattern using reflected high-energy electron diffraction, also as described below.

One preferred cuprate compound for use in forming the high-$T_c$ superconductor films is a bismuth cuprate polytype metal oxide having the general formula, $Bi_2Sr_2Ca_{n-1}Cu_nO_{2n+4}$ where n is 2-5. As is well known, the stoichiometric numbers are not necessarily integers. Rather there exists a solid solubility range in which, for example, Sr may be 1.8 or 1.9, rather than 2.0.

Other high $T_c$ cuprate compounds which can be used in forming the high $T_c$ films, including particularly the junction molecular layers in the films, include yttrium cuprates of the type $M_1Ba_2Cu_3O_{7-()}$, where M is Y, Nd, La, Sm, Eu, Gd, Dy, Ho, Er, Tm, Yb, or Lu ("1-2-3" or "yttrium" compound), and thallium cuprates of the type $Tl_2Ca_{1.5}BaCu_3O_{8.5+x}$.

Also as indicated in the figure, barrier layer 20 in the junction is a single molecular layer composed of stacked atomic layers making up a unit cell of the crystalline compound making up the layer, also as will be detailed below. The barrier layer may be a semiconductor or insulating metal oxide, and is preferably a cuprate compound which either does not have high $T_c$ properties, or which has been doped to suppress free carriers. The cuprate compound forming the barrier layer is preferably in the same polytype family as the compound forming the high $T_c$ films, to maximize lattice matching and reduce lattice strain. One preferred barrier compound, where the high $T_c$ films are composed of a bismuth cuprate such as described above, is a bismuth cuprate of the form $Bi_2Sr_2(Ca,Sr,Dy,Bi)_{n-1}Cu_nO_{2n+4}$ type metal oxide where n is 2-20, and preferably 5-11, and where Sr, Dy, and/or Bi are substituted as barrier dopants in Ca sites in the barrier layer in an amount sufficient to reduce the conductivity and carrier-density of said barrier layer, as will be described below.

FIG. 3A-3C show the atomic layers making up the molecular layers 34, 20, 36 in junction 16. The lower and upper high $T_c$ layers are formed of a $Bi_2Sr_2Ca_1Cu_2O_8$ compound, the barrier layer is formed of a $Bi_2Sr_2(Ca,Bi)_4Cu_5O_{14}$ compound, where the Ca sites have been doped with Bi. In the figure, the solid circles represent Bi, the open circles, oxygen, the shaded circles, Sr, the smaller circles, Cu, and the circled X's, Ca.

As shown in FIG. 3A, molecular layer 36 is formed of two BiO atomic layers 34$a$, 34$b$, a single SrO atomic layer 34$c$, two CuO atomic layers 34$d$, 34$f$, and a Ca atomic layer 34$e$. The figure illustrates three important features of the lower high-$T_c$ junction film in the junction of the invention. First, the crystal structure and stoichiometry of the molecular layer are effective to confer high $T_c$ properties on the layer. Secondly, the molecular film is free of second-phase defects, i.e., non-uniform clusters of atoms, such as Ca or Cu oxides which are not part of the regular crystal structure of the layer. Finally, the layer also has an atomically flat surface, i.e., does not have localized clusters of atoms above the top atomic CuO layer. In particular, the absence of second phase defects and surface irregularities (which may include second-phase defects) provide a smooth interface with the barrier layer, preventing regions of shorting between the two high-$T_c$ films and/or imperfect crystal growth in the barrier layer.

The barrier molecular layer shown in FIG. 3B contains, in addition to the six atomic layers forming molecular layer 18, three additional atomic Ca/CuO layer pairs, such as the upper pair indicated at 20$j$, 20$k$. The Ca sites in the upper three Ca atomic layers are doped with Bi, as indicated. The figure illustrates two important features of the barrier layer in the junction invention. First, the crystal structure and stoichiometry of the molecular layer are uniform, preventing localized regions of uneven insulating properties. The layer also has an atomically flat upper surface, i.e., does not have localized clusters of atoms above the top atomic CuO layer which might degrade the junction properties between layers 20 and 22.

Molecular layer 22 seen in FIG. 3C has the same atomic layer composition and crystal structure as lower layer 18 described above. In particular, the crystal structure and stoichiometry of the molecular layer are effective to confer high $T_c$ properties on the layer, and the upper surface of the layer is flat, as evidenced by the diffraction patterns using RHEED, as described below.

III. Method of Preparing High-$T_c$ Josephson Junction

In another aspect, the invention includes a method of preparing a hysteretic high-$T_c$ trilayer Josephson junction of the type described above. The method includes forming on a substrate, a first high-$T_c$ cuprate thin film, where this forming includes depositing by atomic layer-by-layer deposition, a final junction molecular layer of the type described above. This junction layer corresponds to layer 34 in FIGS. 2 and 3A.

Over the junction molecular layer is deposited, by atomic layer-by-layer deposition, a barrier layer characterized by a flat two-dimensional surface, as evidenced by the electron diffraction pattern using RHEED. This corresponds to layer 20 in FIG. 2 and 3B.

A second high-$T_c$ cuprate thin film is formed over the barrier layer, and includes depositing on the barrier layer, by atomic layer-by-layer deposition, a second junction molecular layer of the type described above, and corresponding to layer 36 in FIGS. 2 and 3C.

One preferred method and apparatus for carrying out the layer-by-layer deposition is described with reference to FIG. 4 below.

A. Apparatus for Atomic Layer Deposition

Figure 4:
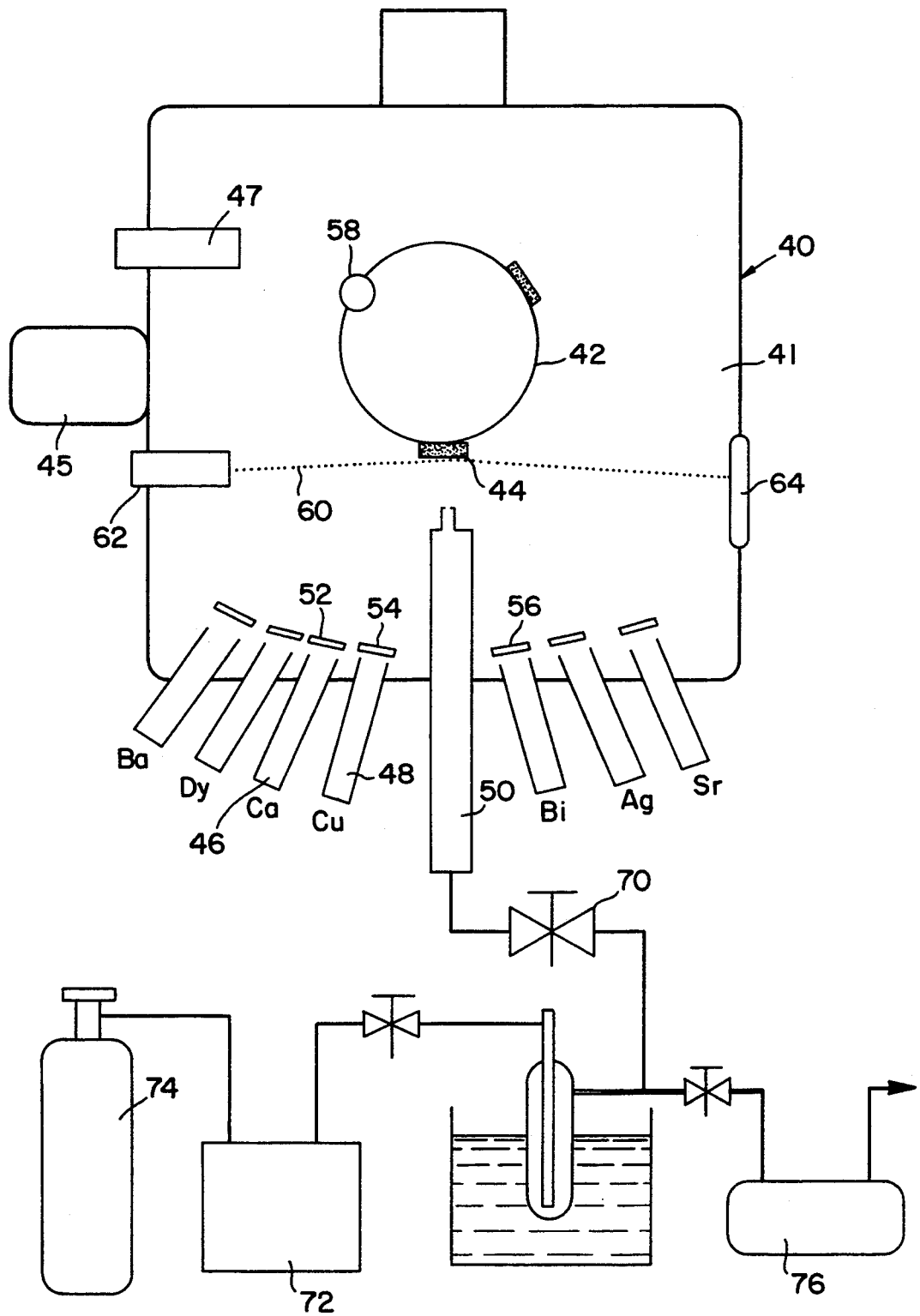
FIG. 4 is a schematic view of a beam deposition apparatus employed in carrying out the method of the invention, in one of its embodiments.

FIG. 4 is a schematic view of a deposition apparatus 40 for use in producing a hysteretic high-$T_c$ Josephson junction, in accordance with the invention. The apparatus is designed for depositing an accurate sequencing of atoms supplied to the growing crystalline surface in such a way as to kinetically control the evolution of the chemical reaction coordinate for each molecular layer. As described below, evidence suggests that under operating conditions, only the top molecular layer is involved in the growth chemistry, so that precise sequences of molecular layers can be assembled into heterostructures (such as superlattices) with little or no intermixing.

FIG. 4 shows key features of an apparatus 40 used in carrying out the method. The apparatus includes a vacuum chamber 41 provided with a substrate holder 42 for positioning a substrate 44 during the deposition process. Preferably, but not necessarily, the substrate comprises a $SrTiO_3$ wafer in order to achieve lattice matching with the deposited compound. The chamber can be evacuated to an operational pressure of less than about $10^{-8}$ Torr, by a high-vacuum pump 45.

It is preferred that the beam deposition method is conducted using a background pressure in the range of about $5 \times 10^{-6}$ to $2 \times 10^{-4}$ Torr, and more preferably at a pressure of about $1 \times 10^{-5}$ Torr. As may be apparent, the pressure at the substrate may be significantly higher, for example, 5 to 10 times higher, than the background pressure owing to differential pumping. Pumping is by a high-vacuum pump 45. Also shown is a quadruple mass spectrometer 47 for characterizing the atomic species in the background gas.

The apparatus also includes a plurality of source furnaces, such as furnaces 46, 48, 50 which in the formation of bismuth cuprates, are used for deposition of Bi, Sr, Cu, and Ca, and as dopants, Ba and Dy. The Ag furnace is used for deposition of silver electrode films. The source furnaces are standard thermal-sources cells (Knudson cells) which can be heated to a selected temperature, e.g., 600° C. to 750° C. for Sr and Ca, and about 1,200° C. for Cu, to produce a desired atomic beam flux from each furnace. The beams are ejected through ports in the furnaces, and these ports are equipped with individual beam shutters, such as shutters 52, 54, 56 for furnaces 46, 48, 50, respectively.

The opening and closing of the individual beam shutters are controlled by conventional pneumatic cylinders (not shown) whose operation is controlled automatically by a computer control unit (not shown). The operation of the control unit, in controlling the sequence and timing of beam deposition, through the operation of the furnace shutters, will be described below.

The apparatus is provided with an ion gauge 58 which is carried on one side of holder 42, as indicated. By rotating the holder to a position where gauge 58 is aligned with a selected beam, the beam flux can be accurately measured. Typically, the beam flux from each source is separately measured prior to and after growth, by rotating the ionization gauge 58 into the deposition position and noting the pressure change occurring when the shutter of each source is opened and closed. The resulting beam pressure readings may be converted to relative beam fluxes by means of a set of coefficients obtained from the analysis of many samples using Rutherford backscattering spectrometry to determine compositions.

Thus, the ionization gauge may be used to determine the deposition time required for the formation of each atomic layer, assuming a constant beam density during successive layer deposition cycles. From this measurement, the time required to lay down an atomic-thickness layer of a single metal can be determined.

In addition, the atomic flux from each source is monitored during deposition to an accuracy of better than one percent using a technique based on pseudo-double-beam atomic absorption spectroscopy (Klausmeier-Brown, et al.). All of the atomic absorption equipment resides outside the high vacuum chamber. In this technique, a mechanically chopped beam of light from a hollow cathode lamp (not shown) passes through the atomic beam path just in front of the substrate position, and is detected using a photomultiplier tube and lock-in amplifier (also not shown). Each atomic source requires its own lamp and optical path. By opening and closing the shutter during the measurement, a pseudo-double-beam effect is achieved, which makes the measurement immune to drifts in reflection and absorption by the viewport windows, gain settings on amplifiers and lamp emission intensity. The technique is sufficiently fast and accurate to detect and correct for changes in beam flux of less than one percent during growth (Eckstein, 1992).

In order to relate the atomic absorption signal from each source to the actual beam flux, calibration films are grown under identical thermodynamic conditions used for "real growths" and the resulting surface density of atoms in the film is obtained by Rutherford Back Scattering (RBS) analysis. Beam flux measurement and control by atomic absorption spectroscopy has proved critical to atomic-layer-by-layer growth of high quality HTS thin films. In particular, it has been found that films that are atomically flat and free of second phase defects can be made only if the growth accurately targets the correct elemental layer stoichiometries to within one to three percent, depending on the specific phase and element in question.

Oxygen is supplied to the growth chamber in the form of an ozone beam from an inlet valve 70 from any suitable source. In the embodiment shown schematically in the figure, an ozone generator (not shown) 72 is provided by generating ozone from a suitable oxygen source 74. The apparatus is further provided with a pump 76 to pump the ozone mass flow.

Oxidation of the metal atoms in a growing HTS film is obtained using a controlled flux of ozone molecules (Berkley, et al.). In the case of cuprate superconductors, growth usually takes place between 600° and 750° C. At this temperature, the ozone is sufficiently reactive to fully oxidize the film even with a relatively low flux of ozone to the sample. The typical oxygen background pressure is between $5.0 \times 10^{-7}$ and $2.0 \times 10^{-5}$ Torr, which permits line-of-sight beam deposition and abrupt beam flux modulation using shutters. The temperature of the heated substrate is controlled to within 1° C. using optical pyrometry.

A reflection high energy electron diffraction (RHEED) gun 62 and screen 64 in the apparatus are used for monitoring crystal structure during film deposition. This utilizes a thin, monoenergetic electron beam (10 KeV) which is incident on the crystal surface at a glancing angle of incidence. The electrons, with a de-Broglie wavelength of about 0.15 Å, diffract from this real space pattern, and in the far field form a $\kappa$-space representation of the apparent surface periodicity. From a flat surface, the diffracted pattern is continuously streaky in one direction, since diffraction is taking place in the orthogonal direction only. In contrast, electrons incident on a surface that consists of oriented three dimensional microcrystals can pass through thin slabs of crystalline material, diffracting in both directions and giving a spotty far field pattern similar to that seen in transmission electron microscopy. Thus, the diffraction pattern displayed provides a $\kappa$-space view of the crystallographic microstructure of the surface (specifically, the lattice constants and the symmetry), its relation to the underlying film, and its flatness or roughness on an atomic scale.

As noted above, an important feature in producing the compounds of the present invention comprises the atomic layer-by-layer molecular beam deposition of the disclosed sequence of compositions. The atomic beams employed in the deposition may be generated by any means known in the art including sputtering, laser ablation and thermal evaporation.

In preparing a thin film of the novel compounds according to the present invention, the material deposited by molecular beam epitaxy may be annealed at a temperature of about 700° C. for a short period of time, for example, several minutes or more. This annealing may improve the crystal structure of the deposited material. Additionally, after annealing the deposited material, additional sequences of atomic layers forming a unit cell may be deposited on the annealed material by the molecular beam epitaxial techniques discussed above in order to produce a film of a desired thickness. The resulting material, including the newly deposited layers, may be subjected to further annealing, if desired, for example at a temperature of about 400°-800° C. in oxygen or ozone.

B. Atomic-Layer-By-Layer Deposition

The method of formation of a molecular layer, by atomic-layer-by-layer deposition, is illustrated for growth of a molecular monolayer of the $Bi_2Sr_2CaCu_2O_8$ (2212) phase by following the evolution of the surface reaction coordinate as revealed in RHEED. FIGS. 5A-5G show a series of diffraction patterns seen along the <110> azimuth of the $SrTiO_3$ substrate at various times during the growth of a molecular monolayer of the 2212 phase, when each atomic layer is sequentially deposited. These patterns form a cycle (solid arrows) that is seen as each molecular layer is grown.

FIGS. 6A-6G show a real-space interpretation of what the diffraction patterns in 5A-5G, respectively, indicate the surface structure to be along this cycle. In the diffraction pattern shown in FIG. 5A, taken after the growth of the $(BiO)_2$ bi-layer (FIG. 6A), the large spacing of intense bundles of satellite streaks corresponds to an in-place distance of ~2.7 Å, while the much smaller satellite-to-satellite spacing is characteristic of the ~27 Å incommensurate structural modulation along the b-axis. This film is a-b place twinned, and the fainter half-order streaks indicate a periodicity of ~5.4 Å seen in the diffraction patterns measuring a-axis structure (Eckstein, et al., 1990). The streaky pattern, without any spots, indicates a surface that is locally atomically smooth and without second-phase inclusions. Observations along other azimuths are consistent with this data.

Following the $Bi_2O_2$ bilayer, a monolayer of Sr is deposited (by this is meant the number of Sr atoms required for the SrO layer in 2212) in the presence of ozone, resulting in the diffraction pattern shown in at FIG. 5B. The diffuse spots seen superimposed on the streaky pattern indicate the growth of three-dimensional polycrystalline domains about 10 to 15 Å in size (FIG. 6B). This pattern shows a textured orientation that can be indexed to the crystal structure of SrO.

Next (FIG. 6C) a monolayer of Cu is deposited and oxidized. During deposition of the copper layer, the diffuse spots characteristic of three-dimensional domains disappear; by the time the copper deposition is complete, the surface is apparently once again flat with an in-place lattice constant and symmetry identical to that seen after the $(BiO)_2$ bi-layer, as shown in FIG. 6C.

An effect similar to that seen after SrO growth appears in the next pattern (FIG. 6D) which shows surface diffraction along the same azimuth, after deposition of the Ca monolayer. The spotty RHEED pattern can be indexed to small three-dimensional domains of CaO. When the growth of the following monolayer of oxidized copper is completed (far left), the surface once again displays only the streaky structure characteristic of the 2212 superconducting phase itself, with somewhat less evidence for the incommensurate structural modulation. A formula unit sequence continues with the growth of the final SrO layer (top, left of center), with dynamics similar to those observed during the first SrO layer. Finally, as the $(BiO)_2$ bilayer is grown, the streaky pattern shown in the first diffraction pattern re-emerges, indicating a flat surface once again. This sequence is repeated for every 2212 molecular formula unit deposited. Similar sequences are also seen during the growth of metastable phases, such as $Bi_2Sr_2Ca_{n-1}Cu_nO_{2n-4}$ for large n, and when certain types of substitutions are used. Together with post-growth analysis, this information helps determine the stoichiometric and thermodynamic conditions that allow for the synthesis of single-phase metastable compounds.

These pattern sequences can be interpreted in terms of a kinetically driven reaction coordinate of the top molecular layer. In particular, the data indicate the formation of stable "sub-phases" after the growth of Cu or Bi layers, which have the same crystallographic structure as the superconductor phase. This is attributable to two related facts. First, strong electric fields exist between the positively charged $(BiO)_2^{2+}$ layers and the negatively charged $CuO_2$ and $(Cu)_2$—Ca—$CuO_2)^{2-}$ layers, leading to a tightly bonded laminated structure. Secondly, in order to form the tightly bonded perovskite structure with touching $O^{2-}$ ions, both the relatively larger $Sr^{2-}$ or $Ca^{2+}$ ions as well as the smaller $Cu^{2-}$ ions are required. When the Cu layers are complete, both of these criteria are satisfied. On the other hand, surfaces with stoichiometries that do not allow such closely packed structures to form, do the next best thing—using the available atoms, they form intermediate chemical states of other stable binary or ternary oxide phases on top of the underlying stable crystal structure. These phases are not present in post-growth x-ray diffraction (XRD) analysis, but their transient existence is evidenced by the transient diffuse spots seen in the RHEED patterns shown.

The formation of the intermediate state shown in FIG. 6D after deposition of Ca can be avoided by depositing both Cu and Ca at the same time. In that case, no evidence for three-dimensional CaO growth is seen; instead, a RHEED pattern similar to that shown along the dotted path (FIG. 6G) is seen throughout the growth of the $CaCu_2O_4$ layer. The absence of spots indicates that no three-dimensional structure occurs as an intermediate reaction state (FIG. 6G); only streaks characteristic of the superconductor structure are seen. For larger n-layer compounds, streaky patterns are also seen when $CaCuO_2$ layers are codeposited, indicating that this is the basic two-dimensional building block for the perovskite subcell. In this way, the evolution of the reaction coordinate can be directed by manipulating the sequence of atoms available for surface reaction. In particular, this shows that the crystallographic order of the growing surface is better when the dotted reaction path is followed, employing this kind of partial codeposition.

Under microscopic examination the surfaces of such films exhibit flat, featureless single crystal field regions with isolated second-phase defects. On films grown sufficiently near the correct phase stoichiometry, such second phase defects are absent, leaving only the single crystal field region. AFM and STM characterization indicates surfaces that are smooth to $<\pm 10$ Å over several-micron-sized areas, consistent with the expected smoothness of the substrate (Bozovic, et al., 1990). Thus, they are well suited for electronic device applications involving layered structures—as noted previously, the apparatus functions to deposit a predetermined sequence of atomic monolayers on the target, as will now be described for an exemplary high-$T_c$ Josephson junction.

C. Preparing High-$T_c$ Trilayer Josephson Junction

The layer architecture used in a Josephson junction device formed in accordance with the invention consist of 50 molecular layers of c-axis $Bi_2Sr_2CaCu_2O_8$, followed by a single molecular layer of barrier material, and finally capped by another 40 molecular layers of c-axis $Bi_2Sr_2CaCu_2O_8$. The barrier layer in this case was chosen to be a metastable compound that can be grown by atomic layering. Its structure was that of $Bi_2Sr_2Ca_7Cu_2O_{20}$ (2278); however, some Bi and Sr were intentionally substituted on the Ca site to facilitate the growth and to reduce the carrier density and conductivity. This compound is readily obtained using atomic layer-by-layer deposition, depositing six extra $CaCuO_2$ layers in the perovskite subcell, compared with the growth of $Bi_2Sr_2CaCu_2O_8$, as illustrated in FIG. 3B.

Following growth, the film was processed into simple four-contact vertical transport test structures by a combination of wet chemical etching (for device isolation), and ion milling (to expose the $Bi_2Sr_2CaCu_2O_8$ base electrode layer and define the 30 μm by 30 μm device mesa), as shown schematically in FIG. 1. Sputtered $SiO_2$ was used as an isolation layer to bring the top counterelectrode layer contacts to large pads for probing. Contacts were formed by evaporation of silver, without any annealing, and were found to be ohmic between 4.2 and 300 K.

Figure 7A:
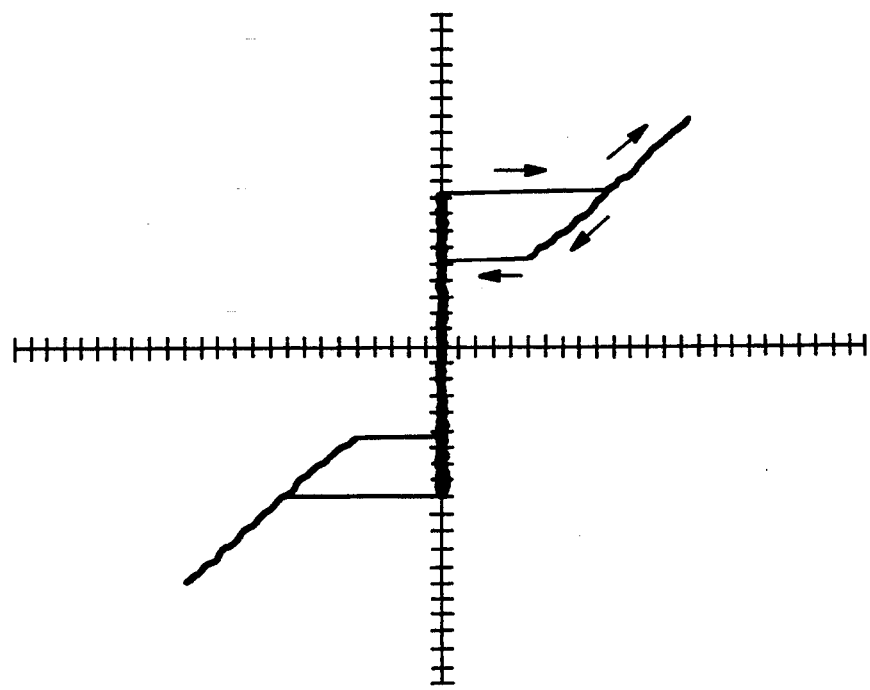
FIGS. 7A and 7B show the current-voltage characteristics of a trilayer Josephson junction formed in accordance with the invention, measured at 4.2 K (7A), and current-voltage characteristics of a trilayer Josephson junction formed in accordance with the invention and illuminated with 16.8 GHz microwave radiation.

Device properties were measured at cryogenic temperatures using an oscilloscope, and a current source consisting of a triangle wave voltage source in series with a 100 Ω resistor. FIG. 7A shows the I-V characteristic measured at 4.2 K. The vertical scale is 200 μA/div and the horizontal scale is 200 μV/div. The device is characterized by a shunt resistance that extrapolates almost through the origin, showing an "excess current" of less than 5% of the $I_c$ value. The characteristic shows hysteretic behavior that is consistent with a constant conductance junction with a large McCumber parameter, $\beta_c = 2\pi^2 CI_c/\phi_0$, of the order of 10; here R is the shunt resistance, C the junction capacitance, $I_c$ the junction critical current and $\phi_0$ the flux quantum.

As seen in FIG. 7A, when the current exceeds $I_c$ (380 μA for this device), the voltage jumps discontinuously to 400 μV and then proceeds up the resistor line. In the reverse direction the curve follows the resistor line to a current of about 210 μA and then jumps discontinuously back to the zero-voltage axis. The measured I-V curve did not change for sweep frequencies between 0.5 and 30 Hz. The resistance R is approximately 1.1 Ω and the $I_cR$ voltage is about 400 μV. The device functioned as a Josephson junction up to 30 K. Above 15 K the hysteresis was absent, the critical-current value was reduced, and the normal state resistance value, taken from the asymptotic slope of the I-V curve, remained near 1 Ω with the same value of excess current seen at 4.2 K. It is of interest to note that the value of R inferred from the I-V curves remained relatively constant as temperature increased. Above 30 K no supercurrent was observed, although the resistance through the barrier layer remained between 1 and 2 Ω all the way up to 80 K, i.e., up to the superconducting transition temperature of the 2212 electrodes. Measurement of the barrier layer resistance at higher temperatures was impeded by the spreading resistance of the base and counter electrodes, which contributes in series with the junction resistance. While this weak temperature dependence suggests that tunneling may be playing a role in the operation of the device, the I-V data offer no clear evidence of tunneling.

Figure 7B:
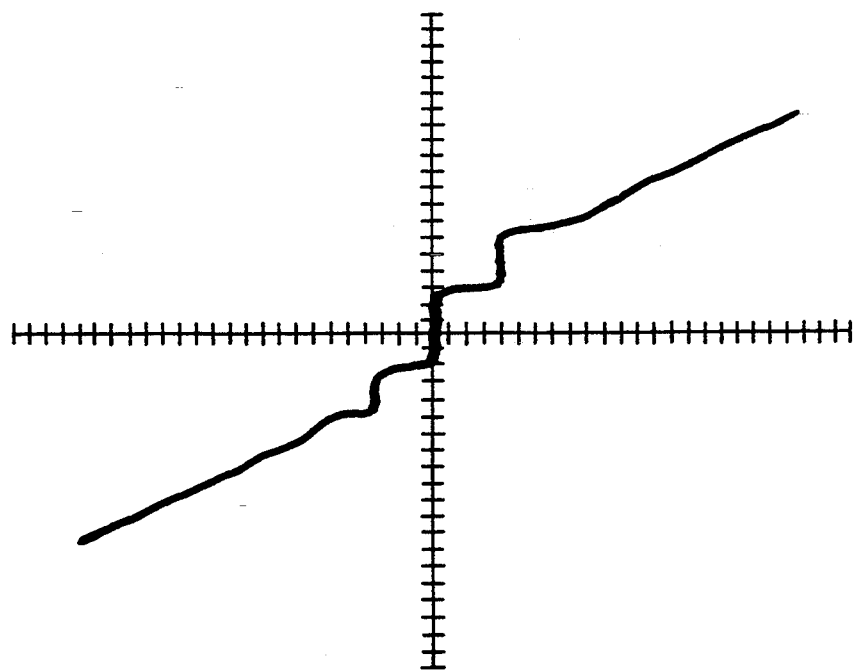

In order to confirm phase coherence across the junction the device was illuminated with microwaves and the response of the junction was studied. FIG. 7B, taken at a temperature of 9 K and a frequency of 17.9 GHz, shows clean Shapiro steps and reduced zero voltage current when the junction was illuminated with a moderate microwave power. Such curves were observed when the microwave power was sufficient to reduce the zero voltage current below the return current value of 210 μA.

IV. Tuning the High-$T_c$ Josephson Junction Current or Voltage Characteristics Several other barrier designs were investigated (Klausmeier-Brown, et al., 1992) as listed in Table I.

Figure 8:
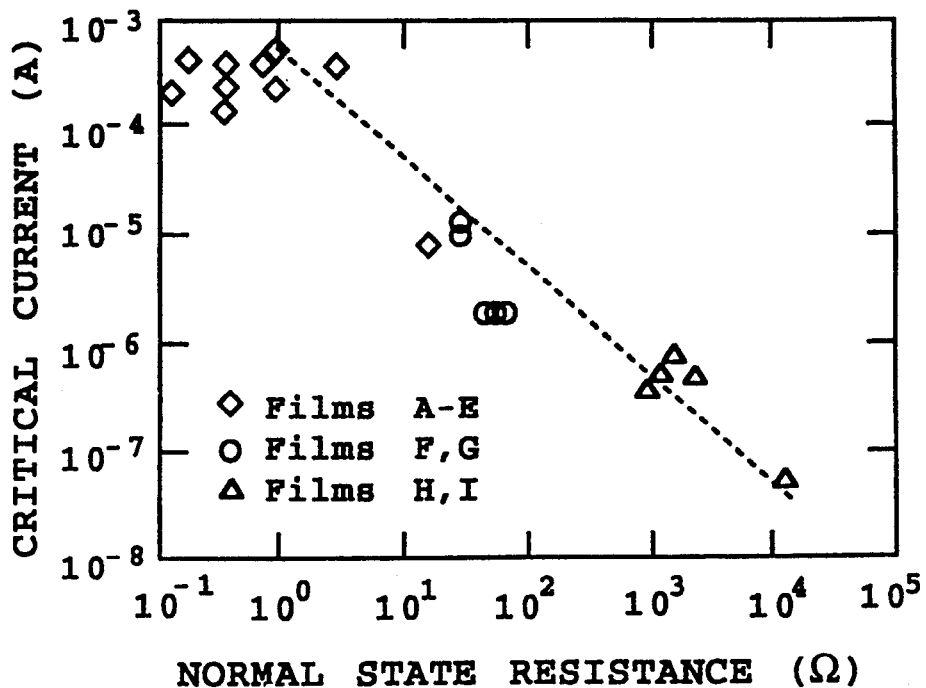
FIG. 8 is a plot of critical current vs. normal state resistance for several trilayer Josephson junctions formed in accordance with the invention.

Specifically, by doping similar metastable single molecular layers with Dy, significantly more resistive barriers were obtained. Two values of Dy doping were studied. In one, 0.5 of a Ca atom was substituted by Dy per formula unit, which is expected to dope well beyond the metal-to-insulator transition (Tamegai, et al., 1989). Vertical transport trilayer Josephson junctions were fabricated using the same process described above. FIG. 8 summarizes the results obtained. Devices doped more lightly with Bi had higher critical currents and lower normal state resistance; devices doped more heavily and with Dy had lower critical currents and much higher normal state resistance. Scaling of the junction critical current and normal state resistance over three orders of magnitude was obtained, while the $I_c R_n$ product remained approximately constant at 0.5 mV. As seen from the figure, both critical current or normal state resistance could be selectively varied over a range of about 4 orders of magnitude following this approach.

TABLE I

Barrier layer structure and device characteristics for a series of nine films. The amount of Bi or Dy doping in the barriers is given in terms of atomic monolayers of dopant per molecular layer of barrier material; for cuprate superconductors, this is equivalent to the formula-unit concentration, e.g., Bi = 2.0 in $Bi_2Sr_2CaCu_2O_8$

| Film | Barrier Layer Structure | Barrier Dopant | Crit. Current ($\mu$A) |
|---|---|---|---|
| A–D E | $Bi_2Sr_2(Ca,Sr,Bi)_7Cu_8O_{20}$ (34 Å) | Bi = 0.50 | 100–400 |
| F,G | $Bi_2Sr_2(Ca,Dy)_{20}Cu_{11}O_{26}$ (43 Å) | Bi = 0.84 | 10–300 |
| H | $Bi_2Sr_2(Ca,Dy)_4Cu_5O_{14}$ (25 Å) | Dy = 0.50 | 2–10 |
| I | $Bi_2Sr_2(Ca,Dy)_9Cu_{10}O_{24}$ (40 Å) | Dy = 1.85 | 0.1–10 |

The ability to precisely program the layering of these trilayer films on an atomic scale presents opportunities for detailed study of transport physics in these materials. To illustrate this point, consider film H, as described in Table I, which has a barrier layer consisting of $Bi_2Sr_2(Ca,Dy)_4Cu_5O_{14}$ heavily doped with Dy.

Figure 9:
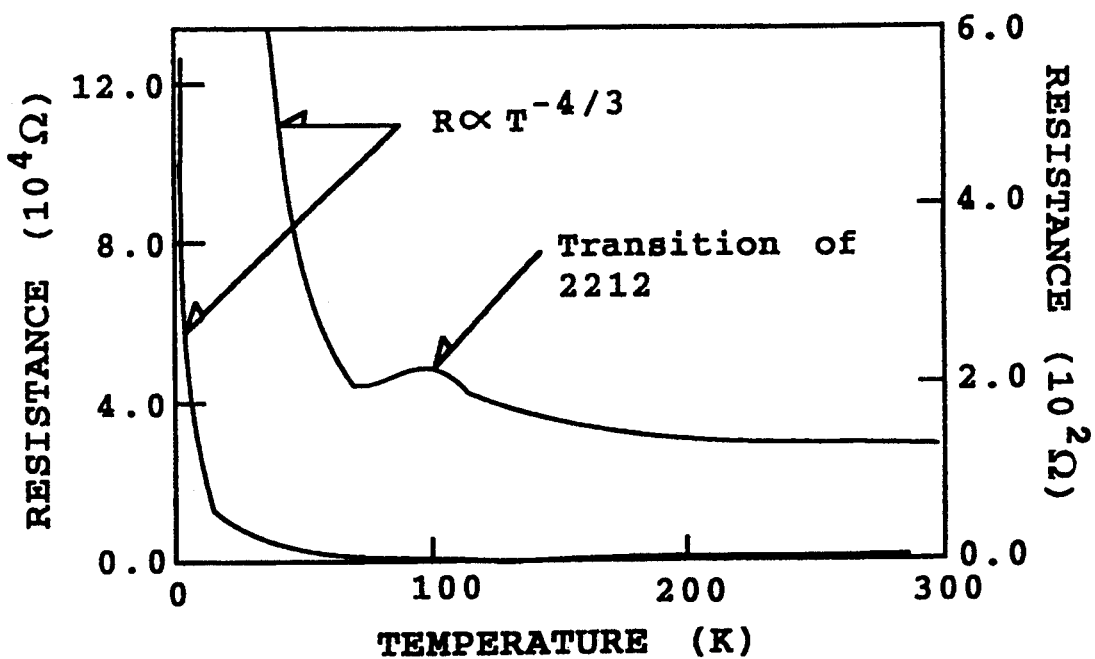
FIG. 9 is a plot of vertical transport resistance vs. temperature for a Josephson junction containing a barrier layer doped with Dy.

This results in devices with resistance versus temperature (R-T) curves are shown in FIG. 9. The data shown in this figure demonstrate two important points. First, that the resistance rises to a very large value with decreasing temperature shows that a very thin barrier layer (~25 Å) can be grown without leakage due to pinholes or second phase inclusions, over a relatively large area of (30 $\mu$m)$^2$. Second, above 15 K the resistance is proportional to $T^{-4/3}$. This temperature dependence is consistent with inelastic tunneling via two localized states in the barrier. At lower temperatures a large fraction of the transport is due to elastic tunneling. By studying transport in samples such as these, with accurately grown layer architectures, basic questions providing a deeper understanding of this phenomena can be systemically addressed.

Although the invention has been described with respect to particular embodiments and methods, it will be appreciated that various changes and modification may be made without departing from the invention.

It is claimed:

1. A hysteretic high-$T_c$ trilayer Josephson junction device comprising
    a substrate,
    first and second high-$T_c$ superconducting cuprate films formed on the substrate,
    a molecular insulating barrier layer between the two films, and
    current and voltage electrodes between said first and second high-$T_c$ layers,
    said junction being characterized by
        (i) a critical current of greater than 10 $\mu$A; and
        (ii) significant I-V hysteresis.

2. The junction device of claim 1, wherein
    said first and second films each has a high-$T_c$ film has a junction molecular layer adjacent said barrier layer which is characterized by a high-$T_c$ cuprate stoichiometry and crystal structure, and a flat two-dimensional surface, as evidenced by its electron diffraction pattern using reflected high-energy electron diffraction, and said barrier layer is characterized by a flat two-dimensional surface, as evidenced by the electron diffraction pattern using reflected high-energy electron diffraction.

3. The junction device of claim 2, wherein said high-$T_c$ molecular junction layers are formed of $Bi_2Sr_2Ca_{n-1}Cu_nO_{2n+4}$ type metal oxides, where n is 2–5, and the barrier layer is formed of $Bi_2Sr_2(Ca,Sr,Dy,Bi)_{n-1}Cu_nO_{2n+4}$ type metal oxide where n is 2–20, and Sr, Dy, and/or Bi are substituted as barrier dopants in Ca sites in the barrier layer in an amount sufficient to reduce the conductivity and carrier density of said barrier layer.

4. The junction device of claim 1, wherein said first and second high-$T_c$ films are formed of $Bi_2Sr_2Ca_{n-1}Cu_nO_{2n+4}$ type metal oxides, where n is between about 2–5, and the insulating barrier layer is formed of $Bi_2Sr_2(Ca,Sr,Dy,Bi)_{n-1}Cu_nO_{2n+4}$ type metal oxide where n is between about 2–20, and Sr, Dy, and/or Bi are substituted in Ca sites as barrier dopants in the barrier layer in an amount sufficient to reduce the conductivity and carrier density of said barrier layer.

5. The junction device of claim 4, wherein said first and second high-$T_c$ films are formed of $Bi_2Sr_2CaCu_2O_8$ oxide, and the barrier layer is formed of a $Bi_2Sr_2(Ca,Sr,Dy,Bi)_{n-1}Cu_nO_{2n+4}$ type metal oxide where n is 7–10, and the barrier dopant is present at a stoichiometry between 0.5 and 1.

6. In a high-$T_c$ trilayer Josephson junction having first and second high-$T_c$ cuprate thin films separated by a molecular insulating barrier layer, an improvement effective to achieve I-V hysteresis characteristics in the junction comprising
    a junction molecular layer in each of said first and second films adjacent said barrier layer, which junction layer is characterized by a high-$T_c$ cuprate lattice stoichiometry and crystal structure, and a flat two-dimensional surface, as evidenced by its electron diffraction pattern using reflected high-energy electron diffraction,
    said barrier layer being characterized by a flat two-dimensional surface, as evidenced by the electron diffraction pattern using reflected high-energy electron diffraction.

7. The junction of claim 6, wherein said junction high-$T_c$ molecular layers are formed of $Bi_2Sr_2Ca_{n-1}Cu_nO_{2n+4}$ type metal oxides, where n is 2–5, and the insulative barrier layer is formed of $Bi_2Sr_2(Ca,Sr,Dy,Bi)_{n-1}Cu_nO_{2n+4}$ type metal oxide where n is between about 2–20, and Sr, Dy, and/or Bi are substituted as barrier dopants in Ca sites in the barrier layer in an amount sufficient to reduce the conductivity and carrier density of said barrier layer.

8. The junction of claim 7, wherein said first and second-high-$T_c$ films are formed of $Bi_2Sr_2CaCu_2O_8$ oxide, and the insulative barrier layer is formed of a $Bi_2Sr_2(Ca,Sr,Dy,Bi)_{n-1}Cu_nO_{2n+4}$ type metal oxide where n is 7-10, and the barrier dopant is present at a stoichiometry between 0.5 and 1.

9. A method of preparing a hysteretic high-$T_c$ trilayer Josephson junction comprising forming on a substrate a first high-$T_c$ cuprate thin film, where said forming includes depositing by atomic layer-by-layer deposition, a final junction molecular layer which is characterized by a high-$T_c$ cuprate stoichiometry and crystal structure, absence of second-phase defects, and a flat two-dimensional surface, as evidenced by its electron diffraction pattern using reflected high-energy electron diffraction, depositing over said junction layer by atomic layer-by-layer deposition, a barrier layer characterized by a flat two-dimensional surface, as evidenced by the electron diffraction pattern using reflected high-energy electron diffraction, depositing over said barrier layer, a second high-$T_c$ film having a junction molecular layer which is characterized by a high-$T_c$ cuprate stoichiometry and crystal deposition, and forming current and voltage electrodes between said first and second high-$T_c$ electrodes.

10. The method of claim 9, wherein said junction molecular layers and said barrier layer are formed by atomic layer-by-layer deposition of atomic metal produced by a thermal source, in the presence of ozone.

11. The method of claim 10, wherein said junction high-$T_c$ molecular layers are formed of $Bi_2Sr_2Ca_{n-1}Cu_nO_{2n+4}$ type metal oxides, where n is 2-5, and the barrier layer is formed of $Bi_2Sr_2(Ca,Sr,Dy,Bi)_{n-1}Cu_nO_{2n+4}$ type metal oxide where n is 2-20, and Sr, Dy, and/or Bi are substituted as barrier dopants in Ca sites in the barrier layer in an amount sufficient to reduce the conductivity and carrier density of barrier layer.

12. The method of claim 11, wherein said first and second high-$T_c$ films are formed of $Bi_2Sr_2CaCu_2O_8$ oxide, and the insulative barrier layer is formed of a $Bi_2Sr_2(Ca,Sr,Dy,Bi)_{n-1}Cu_nO_{2n+4}$ type metal oxide where n is 7-10, and the barrier dopant is present at a stoichiometry between 0.5 and 1.

13. The method of claim 9, wherein said barrier layer is formed by depositing n−2 extra $CaCuO_2$ atomic layers in the molecular layer.

14. In a method of forming a high-$T_c$ trilayer Josephson junction having first and second high-$T_c$ cuprate thin layers separated by a molecular insulating barrier layer, an improvement effective to achieve I-V hysteresis characteristics in the junction comprising depositing by atomic layer-by-layer deposition, a junction molecular layer in said first film which is characterized by a high-$T_c$ cuprate lattice stoichiometry and crystal structure, and a flat two-dimensional surface, as evidenced by its electron diffraction pattern using reflected high-energy electron diffraction, depositing said barrier layer by atomic layer-by-layer deposition to achieve a molecular layer characterized by a flat two-dimensional surface, as evidenced by the electron diffraction pattern using reflected high-energy electron diffraction, and depositing said junction molecular layer in said second high-$T_c$ film by atomic layer-by-layer molecular deposition to achieve a layer which is characterized by a high-$T_c$ cuprate lattice stoichiometry and crystal structure.

15. The method of claim 14, wherein said depositing includes layer-by-layer deposition of atomic metal produced by a thermal source, in the presence of ozone.

16. In a method of forming a high-$T_c$ trilayer Josephson junction having first and second high-$T_c$ cuprate thin layers separated by a molecular insulative barrier layer, an improvement effective to achieve a desired critical current or normal state resistance in the junction comprising depositing by atomic layer-by-layer deposition, a junction molecular layer in said first film formed of $Bi_2Sr_2Ca_{n-1}Cu_nO_{2n+4}$ type metal oxides, where n is between 2-5, and a flat two-dimensional surface, as evidenced by its electron diffraction pattern using reflected high-energy electron diffraction, depositing by atomic layer-by-layer deposition, the barrier layer formed of a $Bi_2Sr_2(Ca,Sr,Dy,Bi)_{n-1}Cu_nO_{2n+4}$ type metal oxide, where n is greater than 2-20, and Sr, Dy, and/or Bi are substituted as barrier dopants in Ca sites in the barrier layer in an amount effective to produce a desired critical current or normal state resistance in the completed junction, and depositing by atomic layer-by-layer deposition, a junction molecular layer in said first film formed of $Bi_2Sr_2Ca_{n-1}Cu_nO_{2n+4}$ type metal oxides, where n is greater than 1, and a flat two-dimensional surface, as evidenced by its electron diffraction pattern using reflected high-energy electron diffraction.

17. The method of claim 16, wherein the dopant added to the barrier layer is Bi, at a dopant concentration of less than 10% Ca sites when a high critical current and low normal state resistance is desired, and the dopant added to the barrier layer is Dy, at a dopant concentration of greater than about 15% Ca sites, when a low critical current and high normal state resistance is desired.

18. The method of claim 17, wherein the choice and amount of dopant is effective to vary the critical current and normal state resistance over a range of about 4 orders of magnitude.

* * * * *